United States Patent
Soeta (10) Patent No.: US 7,591,713 B2
(45) Date of Patent: Sep. 22, 2009

(54) POLISHING PAD, METHOD FOR PROCESSING POLISHING PAD, AND METHOD FOR PRODUCING SUBSTRATE USING IT

(75) Inventor: Yasutsugu Soeta, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 164 days.

(21) Appl. No.: 10/573,497

(22) PCT Filed: Sep. 17, 2004

(86) PCT No.: PCT/JP2004/013661
§ 371 (c)(1),
(2), (4) Date: Mar. 27, 2006

(87) PCT Pub. No.: WO2005/030439
PCT Pub. Date: Apr. 7, 2005

(65) Prior Publication Data
US 2007/0032175 A1    Feb. 8, 2007

(30) Foreign Application Priority Data
Sep. 26, 2003 (JP) .............................. 2003-335939

(51) Int. Cl.
*B24B 7/30* (2006.01)
*B24D 11/00* (2006.01)
(52) U.S. Cl. ............................. 451/41; 451/56; 451/527
(58) Field of Classification Search .................. 451/41, 451/56, 526–539
See application file for complete search history.

(56) References Cited

U.S. PATENT DOCUMENTS

| 6,120,366 | A  | * | 9/2000  | Lin et al. ..................... 451/550 |
| 6,159,088 | A  | * | 12/2000 | Nakajima .................... 451/527 |
| 6,783,436 | B1 | * | 8/2004  | Muldowney ................. 451/41  |
| 6,843,711 | B1 | * | 1/2005  | Muldowney ................ 451/527 |
| 7,037,184 | B2 | * | 5/2006  | Petroski et al. ............. 451/532 |

(Continued)

FOREIGN PATENT DOCUMENTS

JP      A 07-321076     12/1995

(Continued)

*Primary Examiner*—Dung Van Nguyen
(74) *Attorney, Agent, or Firm*—Oliff & Berridge, PLC (57) ABSTRACT

The present invention is a polishing pad used for polishing a semiconductor substrate, wherein, at least, grooves having a radial pattern are formed on a surface of the polishing pad, and (an average value of the sum totals of the groove volumes in parts immediately below the substrate/area of the substrate) is 0.06 to 0.23, or the grooves are formed so that a groove depth of the groove parts located nearer to the center than the substrate is shallower than a groove depth of the groove parts existing immediately below the substrate, and an intersection point where the grooves overlap each other at the central part of the radial pattern of the grooves does not exist immediately below the substrate, a method for processing it, and a method for producing a substrate using this. Thereby, there can be provided a polishing pad, by which in the polishing of a semiconductor substrate, a required amount of a polishing agent is supplied to the central part of the substrate and thereby polishing can be performed with high flatness and furthermore the semiconductor substrate surface is not flawed because peeling, twist, or burr does not occur, a method for processing it, and a method for producing a substrate.

11 Claims, 4 Drawing Sheets

U.S. PATENT DOCUMENTS

| | | | |
|---|---|---|---|
| 7,125,318 B2 * | 10/2006 | Muldowney | 451/41 |
| 2002/0068516 A1 | 6/2002 | Chen et al. | |
| 2002/0083577 A1 | 7/2002 | Suzuki | |

FOREIGN PATENT DOCUMENTS

| | | |
|---|---|---|
| JP | A 11-285963 | 10/1999 |
| JP | A 2000-286218 | 10/2000 |
| JP | A 2000-354952 | 12/2000 |
| JP | A 2001-121405 | 5/2001 |
| JP | A-2001-138212 | 5/2001 |
| JP | A 2001-212752 | 8/2001 |
| JP | A 2002-100592 | 4/2002 |
| JP | A-2002-200555 | 7/2002 |
| JP | A 2002-343749 | 11/2002 |
| JP | A 2002-367937 | 12/2002 |
| JP | A2003-062748 | 3/2003 |
| JP | A-2003-165049 | 6/2003 |

* cited by examiner

CONVENTIONAL ART

POLISHING PAD, METHOD FOR PROCESSING POLISHING PAD, AND METHOD FOR PRODUCING SUBSTRATE USING IT

TECHNICAL FIELD

The present invention relates to a polishing pad for polishing a main surface of a substrate particularly a semiconductor substrate, a method for processing the polishing pad, and a method for producing a substrate using the polishing pad.

BACKGROUND ART

For a semiconductor substrate, high surface flatness is required because semiconductor devices are formed on a main surface thereof. This is because the minimum line width of wires constituting the semiconductor devices is very small, 0.2 μm or less, and therefore failures such as breaking are required to be reduced by flattening a main surface of the semiconductor substrate. This minimum line width of wires tends to be even smaller for increasing integration degree of semiconductor devices. Along with this, more improvement of surface flatness of semiconductor substrates has been required.

Figure 3:
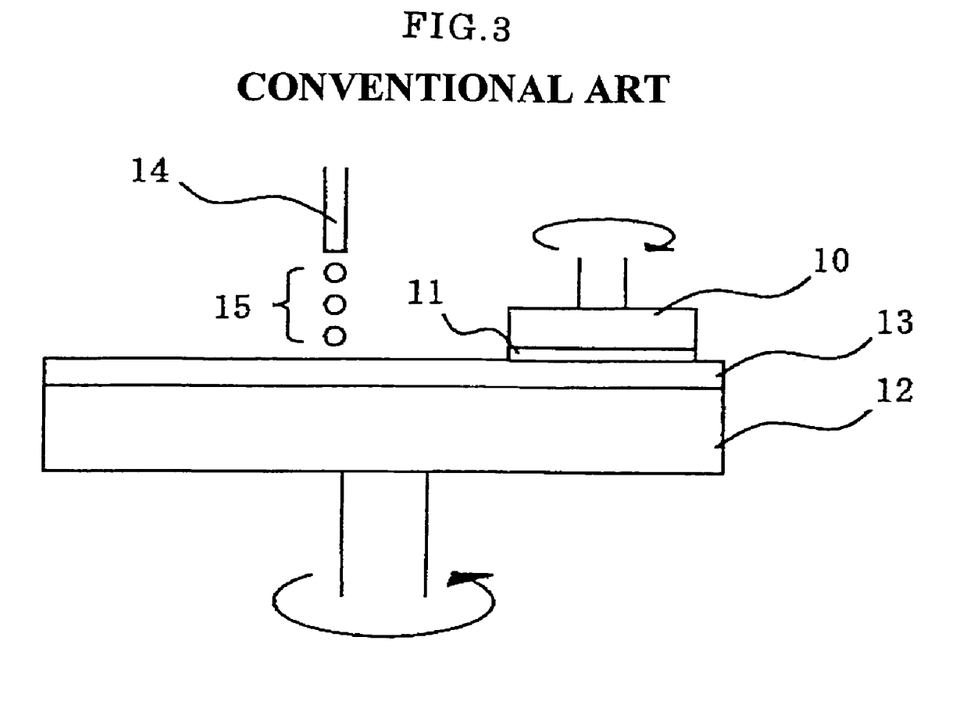
FIG. 3 is a schematic view of polishing a semiconductor substrate with a conventional polishing pad.
Figure 4:
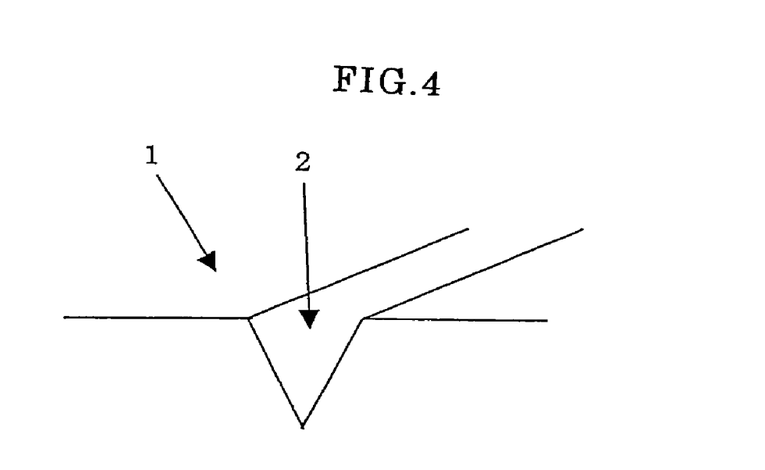
FIG. 4 is a cross-section perspective view showing a groove formed on a polishing pad surface.

For improving the surface flatness of semiconductor substrates, polishing materials for polishing the surface become important. In the case of single-side polishing such as CMP (Chemical Mechanical Polishing), as shown in FIG. 3, a semiconductor substrate 11 held by a polishing head 10 is pressed with a desired pressure onto a polishing pad 13 attached on a polishing apparatus turn table 12. The turn table 12 and the semiconductor substrate 11 rotate by a predetermined rotation rate, and at the same time, a polishing agent (slurry) 15 is supplied from the vicinity of the center of the turn table by a nozzle 14, this polishing agent 15 gets between the semiconductor substrate 11 and the polishing pad 13 and therefore polishing proceeds.

The polishing method is about the same at whatever size the semiconductor substrate is. However, sizes of semiconductor substrates become larger for lowering cost of semiconductor devices. In the polishing, rotations of a semiconductor substrate and a turn table are required for maintaining uniformity of polishing within the semiconductor substrate surface. However, enlargement of diameters of semiconductor substrates increases centrifugal force in the peripheral part of a semiconductor substrate by rotation of the semiconductor substrate and a distance from the peripheral part to the center of the semiconductor substrate. Therefore, a phenomenon that it becomes difficult for a polishing agent to get into the central part of the semiconductor substrate is caused. Therefore, uniform polishing is not performed within the semiconductor substrate surface, and as a result, it can cause to degrade the semiconductor substrate flatness. Accordingly, for making the polishing agent get to the central part of the semiconductor substrate so that uniform polishing can be performed within the semiconductor substrate surface, polishing pads on which grooves having various pattern shapes are formed have been invented.

As the groove pattern shapes, there are a lattice shape (see, for example, Japanese Patent Application Laid-open (kokai) No. 2002-100592, No. 2000-286218, No. 2000-354952, and No. 2002-367937), a triangular lattice shape (see, for example, Japanese Patent Application Laid-open (kokai) No. 2000-354952), a tortoiseshell shape, a radial shape (see, for example, Japanese Patent Application Laid-open (kokai) No. 7-321076, No. 2002-100592), a concentric circle shape (see, for example, Japanese Patent Application Laid-open (kokai) No. 2002-100592), a combination of radial pattern grooves and concentric circular or helical grooves (see, for example, Japanese Patent Application Laid-open (kokai) No. 2000-286218, No. 2000-354952, and No. 2002-367937), and so forth. Any one of them has been intended to enhance retention and flowability of a polishing agent and to make the polishing agent get to the central part of a semiconductor substrate, and thereby to uniform polishing amount within the semiconductor substrate surface.

In the case of forming grooves having a lattice, tortoiseshell, or triangular lattice pattern on the polishing pad, there is some cases the grooves become parallel to the diameter direction of the turn table. However, almost all the grooves do not become parallel. If the grooves are parallel to the diameter direction of the turn table, centrifugal force by rotation of the turn table is propagated to the polishing agent as it is. Therefore, the flowability can be held to be large and the polishing agent can get through the grooves to the central part of the semiconductor substrate surface which is closely in contact with the polishing pad. However, if the grooves are not parallel to the diameter direction, the centrifugal force is divided to the groove direction and the direction orthogonal to the grooves and only the force having the groove direction acts on the polishing agent. Therefore, flowability of the polishing agent becomes smaller. Moreover, the polishing agent getting into the grooves immediately below the substrate is divided into flows at branch points of the grooves while going to an outward direction of the turn table. Therefore, an amount of the polishing agent passing through one groove in itself becomes smaller. As the polishing agent getting through the grooves to the central part of the semiconductor substrate surface becomes less, the polishing agent getting between the polishing pad and the semiconductor substrate also becomes less. As a result, a polishing rate at the central part of the semiconductor substrate surface is smaller than a polishing rate in the peripheral part of the semiconductor substrate surface in which the polishing agent is easy to get into between the polishing pad and the semiconductor substrate from parts but grooves. Therefore, there is a case that flatness of a main surface of the semiconductor substrate can be degraded.

On the other hand, in the case of forming concentric circular or helical grooves on the polishing pad, fine concentric circular concavity and convexity, which are called as a polishing ring, are formed on a surface of a semiconductor substrate which is polished with such a polishing pad. They are generated by transcription of concavity and convexity of the polishing pad to be formed by the grooves into a radial region because grooves of the polishing pad are always in contact with the radial region of the surface as viewed from the center of the semiconductor substrate surface. Therefore, in the case of polishing a semiconductor substrate with a polishing pad on which concentric circular or helical grooves are formed, there is a case that surface flatness of the semiconductor substrate can be degraded. Among the polishing pads, there are ones on which radial pattern grooves and concentric circular or helical grooves are combined to be formed on the polishing pad surface. However, as long as the concentric circular or helical grooves exist on the polishing pad, the problem of a polishing ring is inevitably caused and adversely affects the surface flatness of the substrate.

In the case of forming grooves having a radial pattern on the polishing pad, lowering of the flowability of the polishing agent by dispersion of the centrifugal force, flow division of the polishing agent at the groove parts immediately below the substrate, generation of a polishing ring are not caused.

Therefore, better polishing can be expected as compared to the above-described groove shapes. In Japanese Patent Application Laid-open (kokai) No. 7-321076, No. 2002-100592, and No. 2000-354952, polishing pads on which such radial pattern grooves are formed has been disclosed.

Among them, in the method for producing a semiconductor device of Japanese Patent Application Laid-open (kokai) No. 7-321076, there has been disclosed a polishing pad whose radial pattern grooves have straight lines or curve to the opposite side to the rotation direction of the polishing pad. In this document, it is supposed to be possible to modify number of the radial pattern grooves to be formed or formation interval of the grooves. However, as the diameter of the substrate becomes larger, 200 mm or more, if groove volumes immediately below the substrate to be polished by the radial pattern grooves are not defined, it becomes difficult for the polishing agent to get to the central part of the substrate main surface being in contact with the polishing pad even if a rotation rate of the polishing turn table or the substrate, load for pressing the substrate, type or concentration of the polishing agent, and so forth, are variously changed. Therefore, there is a possibility that surface flatness of the substrate can be degraded.

Moreover, in Japanese Patent Application Laid-open (kokai) No. 2002-100592, there has been disclosed a polishing pad having radial pattern grooves produced by attaching fan-like pieces of the polishing pad to the polishing turn table surface. However, as with the above-described Japanese Patent Application Laid-open (kokai) No. 7-321076, there is the same problem because groove volumes immediately below the substrate to be polished with the radial pattern grooves are not defined.

Moreover, in Japanese Patent Application Laid-open (kokai) No. 2002-367937, with regard to a polishing pad consisting of non-foaming resin, there has been prescribed widths of upper sides and bottom sides of convex parts to be formed between the grooves formed on the polishing pad, and widths of the groove bottom. Certainly, if grooves to be formed on the polishing pad consisting of non-foaming resin has a lattice shape, a triangular lattice shape, a concentric circle shape, or a helical shape, pitches between the grooves can be constant. Therefore, grooves having prescript sizes can be formed. However, in the case of forming only radial pattern grooves on the polishing pad, if it is attempted to apply the groove sizes prescript in the document to radial pattern grooves, it is not clear whether they may be applied in the most peripheral part of the polishing pad or vicinity of the center of the radial pattern grooves or the whole grooves to be formed may fit into the prescript groove sizes. Therefore, there is a problem in which it is impossible to provide a polishing pad having the most appropriate groove intervals between radial pattern grooves in which the polishing agent can be supplied to the central part of the substrate in the polishing, and there is the same problem as Japanese Patent Application Laid-open (kokai) No. 7-321076 and No. 2002-100592 as described above.

By the way, among the semiconductor substrates as described above, importance of an SOI wafer has been enhanced. This is because an SOI wafer in which a silicon active layer is formed on a silicon oxide film of electrical insulation has an oxide film (hereinafter, referred to as a BOX oxide film) that is an insulator between a supporting wafer and the silicon active layer, and therefore electronic devices to be formed on the silicon active layer have large advantages of high dielectric breakdown strength and lower rate of soft error of α-ray and are devices excellent in high-speed property, low power consumption, high breakdown voltage, environment resistance, and so forth. Moreover, in a thin-film SOI wafer having a silicon active layer with a thickness of 1 μm or less, a PN junction area of source and drain can be reduced in MOS (Metal Oxide Semiconductor)-type semiconductor devices formed on a silicon active layer in the case of being operated with complete depletion type and therefore parasitic capacity is reduced and speeding-up of device-driving can be accomplished. Furthermore, capacity of a BOX oxide film as an insulator layer becomes in series with capacity of the depletion layer to be formed immediately below a gate oxide film and therefore the depletion layer capacity is substantially reduced and lowering of power consumption can be accomplished.

Such an SOI wafer is produced, for example, by forming a BOX oxide film on, at least, one of a first wafer (hereinafter, referred to as a bond wafer) and a second wafer (hereinafter, referred to as a base wafer) each having a main surface in which at least one surface is flattened and mirrored, bonding and joining the two main surfaces of them each other, adding heat treatment to strengthen the joining, then grinding and polishing from the opposite side to the main surface of the bond wafer, and thereby forming a silicon active layer having a predetermined thickness on the insulator film.

Moreover, semiconductor devices are formed on a silicon active layer of an SOI wafer and therefore high film-thickness uniformity is required for the silicon active layer. In particular, in the case that the silicon active layer is 0.3 μm or less, particularly about 0.1 μm, the silicon active layer to be polished in itself is thin. Therefore, stock removal tends to become smaller, and it has become a large problem to remove fine concavity and convexity on the surface of the silicon active layer by touch polishing along with maintaining film-thickness uniformity.

Therefore, a suede-type polishing pad on which grooves having a lattice shape, a triangular lattice shape, a tortoiseshell shape, a radial pattern shape, a concentric circle shape, or a helical shape as described above is formed is also used for polishing of the silicon active layer of an SOI wafer. However, problems in quality in which a polishing ring is generated and good film-thickness uniformity cannot be obtained are caused.

DISCLOSURE OF THE INVENTION

Accordingly, an object of the present invention is to provide a polishing pad in which in the polishing of a semiconductor substrate and such, a required amount of a polishing agent is supplied to the central part of the substrate and thereby the polishing can be performed with high flatness, and particularly in the polishing of an SOI wafer, with maintaining film-thickness uniformity of a silicon active layer, fine concavity and convexity on a surface thereof can be removed. Furthermore, an object of the present invention is to provide a method for processing a polishing pad, by which in forming grooves on the polishing pad surface, twist or burr of the polishing pad does not occur and a surface of a semiconductor substrate including an SOI wafer is not flawed, and a method for producing a substrate using such a polishing pad.

In order to accomplish the above objects, according to the present invention, there is provided a polishing pad used for polishing a substrate, wherein grooves having a radial pattern are formed on a surface of the polishing pad, and an average value of the total volumes of all the groove parts existing immediately below the substrate in the grooves (an average value of the sum totals of the groove volumes in parts immediately below the substrate) is 0.06 to 0.23 when represented by [the average value of the sum totals of the groove volumes in parts immediately below the substrate (mm³)/area of the substrate (mm²)].

If an average value of the total volumes of all the groove parts existing immediately below the substrate in the grooves to be formed radially on a polishing pad surface for polishing a substrate is 0.06 or more with respect to the substrate area as described above, a polishing agent supplied between the substrate and the polishing pad in the polishing through the grooves formed on the polishing pad surface exists immediately below the substrate with a required amount independently of the absolute value of the substrate areas, and therefore, a substrate having high surface flatness or an SOI wafer having high film-thickness uniformity can be produced, and if the average value is 0.23 or less, the polishing pad does not generate polishing flaws.

Furthermore, the present invention provides a polishing pad used for polishing a substrate, wherein grooves having a radial pattern are formed on a surface of the polishing pad, and the grooves are formed so that a groove depth of the groove parts located nearer to the center than the substrate is shallower than a groove depth of the groove parts existing immediately below the substrate, and an intersection point where the grooves overlap each other at the central part of the radial pattern of the grooves does not exist immediately below the substrate.

If the grooves are formed so that a groove depth of the groove parts located nearer to the center of the polishing pad than the substrate to be polished is shallower than a groove depth of the groove parts existing immediately below the substrate, a required amount of a polishing agent is supplied to immediately below the semiconductor substrate through the grooves in the polishing. Additionally in the grooving processing, twist of the polishing pad or peeling from the turn table which occur by a width of the polishing pad contained between the grooves near the center of the polishing pad being narrowed does not occur because the grooves are formed so that a depth of the grooves is shallow, and furthermore, an intersection point where the grooves overlap each other at the central part of the radial pattern of the grooves does not exist immediately below the substrate, and therefore, generation of burr on the groove parts to be in contact with the substrate can be prevented. As a result, with the polishing pad, polishing can be carried out in a high grade state so as not to flaw a substrate surface with burr. Polishing pads on which such grooves are formed are particularly suitable for being used as a polishing pad for CMP of single wafer processing without the central part of the polishing pad being cut out. In this time, in the case that the angle between the grooves is more than 5°, even if the grooves are formed by a method for processing grooves by which a depth of the grooves from a peripheral part of the polishing pad to the center thereof are constant, peeling of the polishing pad from the turn table, twist, or burr does not occur in the vicinity of the center of the polishing turn table and therefore there is no problem. However, if the angle between the grooves is 5° or less, peeling of the polishing pad from the turn table, twist, or burr occurs in the vicinity of the center of the polishing turn table, and there is a possibility of the wafer being affected with flaws and such, and therefore using the polishing pad according to the present invention is preferable. Of course, even in the case that the angle between the grooves is more than 5°, as described above, a polishing pad which are formed so that a groove depth of the groove parts located nearer to the center than the substrate to be polished is shallower than a groove depth of the groove parts existing immediately below the substrate can be used.

In this case, it is preferable that the grooves have a constant groove width and are formed so that angles between the grooves are more than the values obtained by the mathematical formula 1 as follows.

An angle between the grooves=2×sin⁻¹(a width of the grooves/(2×(a distance from the center of the polishing pad to the center of the substrate−a radius of the substrate)). (Mathematical Formula 1)

If the grooves are formed so that angles between the grooves are the values obtained by the mathematical formula 1 or less, the overlapping part of the grooves is located immediately below the substrate to be polished. If the overlapping part of the grooves exists immediately below the substrate, triangular ends of the polishing pad that are contained between the radial pattern grooves also exist immediately below the substrate. In these triangular ends, peeling from the turn table, twist, or burr is easy to occur during the processing of the grooves, and if they occur, polishing flaws are caused on a substrate surface by performing polishing process. However, if the polishing pad has grooves having angles more than the above-described angles, locating the overlapping part of the grooves immediately below the substrate can be prevented, and therefore, such generation of polishing flaws can be prevented.

Moreover, it is preferable that the grooves have groove widths of 2.0 mm or less.

If the groove widths are 2.0 mm or less, it becomes less possible that concavity and convexity formed on the polishing pad by the polishing pad surface and the grooves are transferred to the surface of the substrate to be polished and the surface is adversely affected. Furthermore, it is preferable that the groove widths are 1.5 mm or less, because the possibility of affecting adversely becomes lower. Moreover, for keeping some amount of the polishing agent flowing in the grooves, it is more preferable that the groove widths are 0.4 mm or more.

It is preferable that the polishing pad of the present invention is a nonwoven type or a suede type.

Polishing pads of a nonwoven type or a suede type has been widely used generally. If such grooves as described above are formed on such polishing pads, a polishing pad by which a substrate with higher surface flatness or an SOI wafer with high film-thickness uniformity can be produced can be easily provided.

Further, in the present invention, a method for producing a substrate, comprising a step of polishing a substrate by using the polishing pad on which grooves as described above are formed is provided.

By such a producing method for polishing a substrate using the polishing pad on which such grooves as described above are formed, a required amount of a polishing agent is supplied between the substrate and the polishing pad and polishing can be carried out uniformly. Therefore, it is possible to produce a substrate with higher surface flatness or an SOI wafer with higher film-thickness uniformity. Moreover, a substrate can be polished with a polishing pad in which peeling, twist, and burr do not occur and therefore a substrate can be produced without generating polishing flaws on the surface.

In this case, it is preferable that as the substrate to be polished, a silicon single crystal wafer or an SOI wafer is used.

For forming semiconductor devices, a silicon single crystal wafer requires high surface flatness and an SOI wafer requires that film-thickness uniformity of a silicon active layer thereof is maintained. Therefore, according to such a producing method, the requirement for high surface flatness of a silicon single crystal wafer or film-thickness uniformity in a silicon active layer of an SOI wafer can be satisfied. Moreover, this is preferable because polishing flaws are not generated on the surface.

Moreover, the present invention provides a method for processing a polishing pad which is a method for forming grooves on a surface of a polishing pad used for polishing a substrate, comprising forming the grooves so as to have a radial pattern, and at this time forming the grooves so that an average value of the total volumes of all the groove parts existing immediately below the substrate in the grooves (an average value of the sum totals of the groove volumes in parts immediately below the substrate) complies with a relation of 0.06 to 0.23 when represented by [the average value of the sum totals of the groove volumes in parts immediately below the substrate ($mm^3$)/area of the substrate ($mm^2$)].

If the grooves to be formed in a radial pattern on a polishing pad surface for polishing a substrate are formed so that an average value of the total volumes of all the groove parts existing immediately below the substrate in the grooves complies with a relation of 0.06 or more to area of the substrate as described above, a required amount of a polishing agent is supplied between the substrate and the polishing pad in the polishing through grooves independently of the absolute value of the substrate area. Therefore, a substrate having high surface flatness or an SOI wafer having high film-thickness uniformity can be produced. And if the grooves are formed so that the average value complies with a relation of 0.23 or less, the polishing pad by which polishing flaws are not generated can be processed.

Moreover, the present invention provides a method for processing a polishing pad which is a method for forming grooves on a surface of a polishing pad used for polishing a substrate, comprising forming the grooves so as to have a radial pattern, and at this time forming the grooves so that a groove depth of the groove parts located nearer to the center than the substrate is shallower than a groove depth of the groove parts existing immediately below the substrate and an intersection point where the grooves overlap each other at the central part of the radial pattern of the grooves does not exist immediately below the substrate.

If the grooves are formed so that a groove depth of the groove parts located nearer to the center than the substrate is shallower than a groove depth of the groove parts existing immediately below the substrate as described above, a required amount of a polishing agent is supplied to immediately below the substrate in the polishing. Additionally in forming and processing the grooves, twist of the polishing pad or peeling from the turn table which is caused by a width of the polishing pad contained between the grooves in the vicinity of the center of the polishing pad being narrowed is prevented by forming the grooves so that a depth of the grooves is shallow. Furthermore along with this, an intersection point where the grooves overlap each other at the central part of the radial pattern of the grooves does not exist immediately below the substrate, and therefore, generation of burr in groove parts which is in contact with the substrate can be prevented. As a result, a polishing pad by which polishing can be carried out in a high grade state so as not to flaw a substrate surface with burr can be processed. Such groove-processing is particularly suitable for processing a polishing pad for CMP of single wafer processing without the central part of the polishing pad being cut out. In this case, it is preferable to use the processing method of the present invention by the same reason as described above because in the case that the grooves are formed so that the angle between the grooves is 5° or less, there is a possibility that peeling of the polishing pad from the turn table, twist, or burr occurs in the vicinity of the center of the polishing turn table and have an affect of flaws and such on the wafer. Of course, even in the case that the angle between the grooves is more than 5°, a polishing pad can be processed so that a groove depth of the groove parts located nearer to the center than the substrate to be polished is shallower than a groove depth of the groove parts existing immediately below the substrate according to the present invention.

In this case, the grooves are formed so that angles between the grooves are more than values obtained by the mathematical formula 1 as follows.

$$\text{An angle between the grooves} = 2 \times \sin^{-1}(\text{a width of the grooves}/(2 \times (\text{a distance from the center of the polishing pad to the center of the substrate} - \text{a radius of the substrate}))) \quad \text{(Mathematical Formula 1)}$$

If the grooves are formed at angles of the values obtained by the mathematical formula 1 or less, the overlapping part of the grooves exists immediately below the substrate. If the overlapping part of the grooves exists immediately below the substrate, triangular ends of the polishing pad that are contained between the radial pattern grooves also exist immediately below the substrate. In these triangular ends, peeling from the turn table, twist, or burr tends to occur in the processing of the grooves, and if they occur, polishing flaws are generated on the substrate surface by performing the polishing process. Accordingly, if the grooves are formed so as to have angles more than the above-described angles, the overlapping part of the grooves is not located immediately below the substrate, and therefore, a polishing pad by which such polishing flaws are not generated can be processed.

Moreover, it is preferable that the grooves are formed so as to have groove widths of 2.0 mm or less.

If the grooves are formed so as to have groove widths of 2.0 mm or less as described above, it becomes less possible that concavity and convexity to be formed on the polishing pad with the polishing pad surface and the grooves are transferred to a surface of a substrate to be polished and which adversely affects the surface. Furthermore, it is preferable that the groove widths are 1.5 mm or less because the possibility of affecting adversely becomes lower. Moreover, for keeping some amount of the polishing agent flowing in the grooves, it is more preferable that the grooves are formed so that the groove widths are 0.4 mm or more.

Moreover, it is preferable that the polishing pad is a nonwoven type or a suede type.

Polishing pads of a nonwoven type or a suede type has been widely used generally. By forming such grooves as described above on such polishing pads, a polishing pad by which a substrate with higher surface flatness or an SOI wafer with high film-thickness uniformity can be produced can be easily processed.

Furthermore, in the present invention, there is provided a method for producing a substrate, comprising a step of polishing a substrate by using the polishing pad processed by such a method as described above.

By such a producing method for polishing a substrate using the polishing pad processed by such a method as described above, a required amount of a polishing agent is supplied between the substrate and the polishing pad and polishing can be carried out uniformly. Therefore, it is possible to produce a substrate with higher surface flatness or an SOI wafer with higher film-thickness uniformity. Moreover, a substrate can be polished with a polishing pad in which peeling, twist, and burr do not occur and therefore a substrate can be produced without polishing flaws being generated on the surface.

In this case, it is preferable that as the substrate to be polished, a silicon single crystal wafer or an SOI wafer is used.

For forming semiconductor devices, a silicon single crystal wafer requires high surface flatness and an SOI wafer requires that film-thickness uniformity of a silicon active layer thereof is maintained. Therefore, according to such a producing method, the requirement for high surface flatness of a silicon single crystal wafer or film-thickness uniformity in the silicon active layer of an SOI wafer can be satisfied. Moreover, this is preferable because polishing flaws are not generated on the surface.

The polishing pad according to the present invention can produce a substrate with high surface flatness or an SOI wafer with high film-thickness uniformity. Furthermore, with the polishing pad, polishing flaws are not generated on the substrate surface. In particular, with regard to this, the effect is large in the case of a polishing pad of CMP of single wafer processing without the central part of the polishing pad being cut out.

Moreover, by the method for processing a polishing pad according to the present invention, a polishing pad by which a substrate with high surface flatness or an SOI wafer with high film-thickness uniformity can be produced can be processed. And furthermore a polishing pad with which polishing flaws are not generated on a substrate surface can be processed.

By the method for producing a substrate according to the present invention, a substrate with higher surface flatness or an SOI wafer with higher film-thickness uniformity can be produced. Moreover, a substrate can be polished with a polishing pad without peeling, twist, or burr being generated, and therefore a substrate can be produced without polishing flaws being generated on a surface.

BEST MODE FOR CARRYING OUT THE INVENTION

Hereinafter, embodiments of the present invention will be explained by exemplifying a case of polishing a silicon single crystal wafer or an SOI wafer as a substrate. However, the present invention is not limited thereto.

As described above, in the case of forming radial pattern grooves on a polishing pad, lowering of flowability of a polishing agent due to dispersion of centrifugal force, or flow division of the polishing agent in groove parts immediately below the substrate and generation of a polishing ring are not caused, and therefore, better polishing can be expected as compared to the other groove shapes such as a lattice shape or a concentric circle shape. However, in the polishing pad on which radial pattern grooves are formed, there is a problem as follows.

In general, radial pattern grooves are formed on a polishing pad with making angles between the grooves constant. In the case that such a polishing pad having radial pattern grooves as described above is attached to a turn table of an one-side polishing apparatus like a CMP apparatus and a silicon single crystal wafer or an SOI wafer is polished, the wafer is held by a pressure ring of a polishing head being in a certain distance from the center of the polishing pad, thereby a distance between the center of the wafer and the center of the polishing pad becomes constant. Therefore, if diameters of wafers are various, the numbers of the grooves existing immediately below the wafers are also various and amounts of a polishing agent supplied between the wafers and the polishing pads through the grooves result in differences. Therefore, even if polishing is performed with the same polishing apparatus, with the same polishing pad, and on the same polishing condition, in the case that diameters of wafers to be polished are various, final flatness of the surface of the wafers occasionally can result in differences.

On the other hand, for forming radial pattern grooves, for example, a polishing pad is subjected to grooving process with a grooving machine tool. In this case, if the number of the grooves becomes larger, a width of the polishing pad existing between the grooves in the vicinity of the center of the polishing pad is more narrowed, and therefore, the polishing pad peels from the turn table or twists in the grooving process and accurate grooving becomes impossible and at the same time burr can be generated on the edges of the formed grooves. If this burr gets in touch with the wafer surface in the polishing, flaws are generated on the surface and which can adversely affect on the wafer quality significantly. This is a problem particularly caused in the case of a polishing pad without the central part thereof being cut out, which is used in a CMP apparatus of single wafer processing and such.

Therefore, for example, in Japanese Patent Application Laid-open (kokai) No. 2002-100592, there has been disclosed a polishing pad having radial pattern grooves which is produced by attaching fan-like pieces of a polishing pad to a surface of a turn table as described above. Certainly, it is not necessary to form grooves on the polishing pad in this method, and peeling, twist, and burr are not generated. However, the surface height of each piece of the polishing pad must be uniformed and for forming grooves having constant widths, accuracy is also required for attaching it to a turn table. Therefore, in practice, it is difficult to perform the polishing so that flatness of the surface of a silicon single crystal wafer becomes high or to perform polishing with maintaining high film-thickness uniformity of an SOI wafer.

The present inventor has carried out experiments by forming radial pattern grooves on a polishing pad, and polishing silicon single crystal wafers and SOI wafers having various diameters. And he has found that there is a particular relation between volumes of the radial pattern grooves and areas of the silicon single crystal wafers or the SOI wafers, and have accomplished the present invention. Moreover, experiments for forming grooves on various conditions have been performed and a grooving method, in which in forming the grooves, twist of the polishing pad and peeling from a turn table do not occur even if a width of polishing pad contained between the grooves in the vicinity of the center of the turn table are small. And the present invention has been accomplished.

Hereinafter, embodiments of the present invention will be explained in detail with reference to drawings. However, the present invention is not limited to these.

Figure 1:
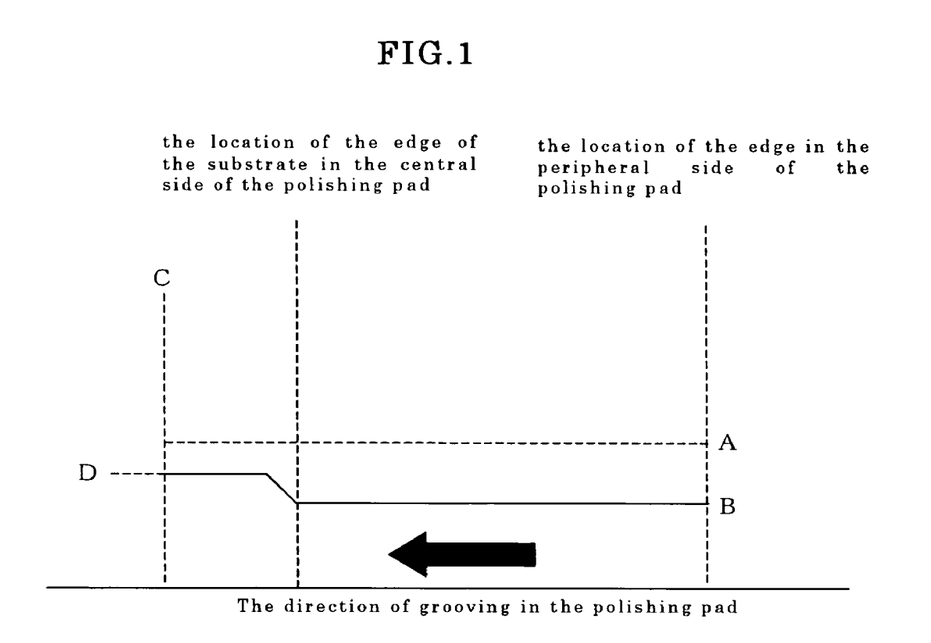
FIG. 1 is a schematic view for explaining a method for processing a polishing pad according to the present invention.

FIG. 1 shows a schematic view for explaining a method for processing a polishing pad according to the present invention.

First, before the processing, with regard to a predetermined silicon single crystal wafer or an SOI wafer to be polished (hereinafter, simply referred to as a wafer, occasionally), grooves to be formed on the polishing pad have a radial pattern, and a value in which an average value of the total volumes of all the groove parts existing immediately below the substrate (an average value of the sum totals of the groove volumes in parts immediately below the substrate) is divided by the wafer area complies with a relation of 0.06 to 0.23, and furthermore groove widths is a desired value of 2.0 mm or less. And an angle between the grooves with which overlapping part of the grooves does not get into immediately below the wafer is calculated from the wafer radius, the distance from the center of the polishing pad to the center of the wafer, and the groove widths. As described above, the grooves to be formed is determined to have groove volumes complying with the above-described relation and to have an angle between grooves which is the calculated angle or more.

Figure 5:
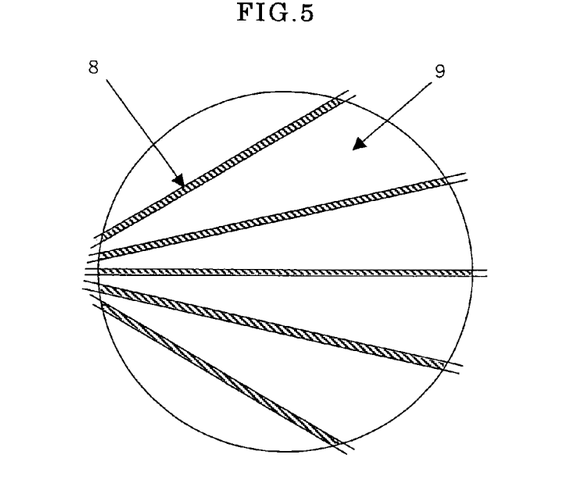
FIG. 5 is a schematic view showing groove parts immediately below a wafer.
Figure 6:
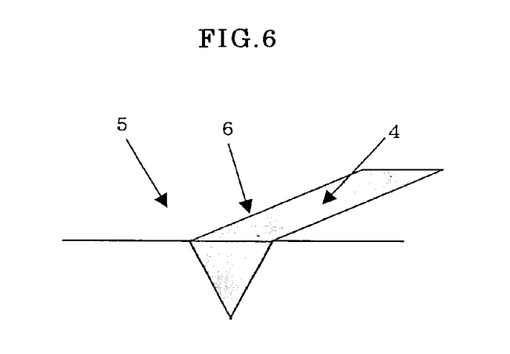
FIG. 6 is a cross-section perspective view showing grooves formed on a polishing pad surface and the groove volume thereof.
Figure 7:
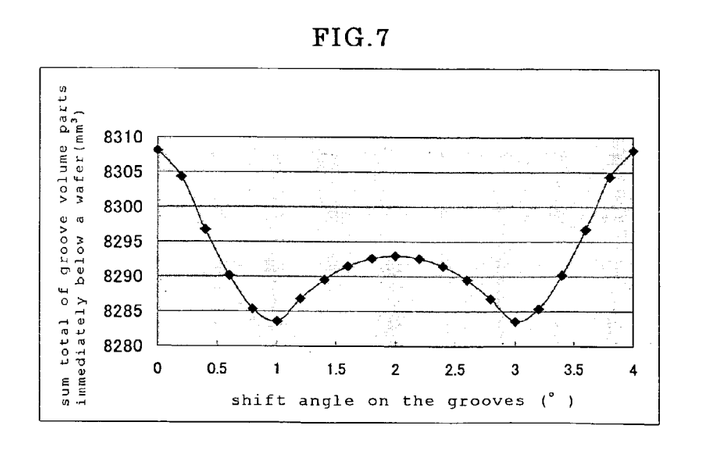
FIG. 7 is a graph showing a change of sum total of groove volume parts immediately below a wafer with rotation of a polishing turn table (in the case that the wafer has a 300-mm diameter).

Here, the above-described average value of the sum totals of the groove volumes in parts immediately below the substrate is explained in more detail. As shown in FIG. 6, the groove volumes are volumes 4 of grooves 6 to be formed on a polishing pad 5. In the groove volumes 4, all the groove parts (see, FIG. 5) existing immediately below the wafer are added and therefore the sum total of the groove volumes immediately below the wafer is obtained. As shown in FIG. 7, the sum total of the groove volumes immediately below the wafer varies with a certain cycle according to a rotation angle (shift angle) by rotation of the polishing turn table to which a polishing pad is attached. The average value of the sum totals of the groove volumes during one cycle thereof becomes the average value of the sum totals of the groove volumes in parts immediately below the wafer. The present inventor has investigated a relation between this and in-plane flatness within a surface of a silicon single crystal wafer or film-thickness uniformity of an SOI wafer. As a result, it has been found that if the relation as described above exists, in-plane flatness within a surface of a silicon single crystal wafer or film-thickness uniformity of an SOI wafer can be maintained good without generating polishing flaws independently of the absolute value of substrate areas.

Figure 8:
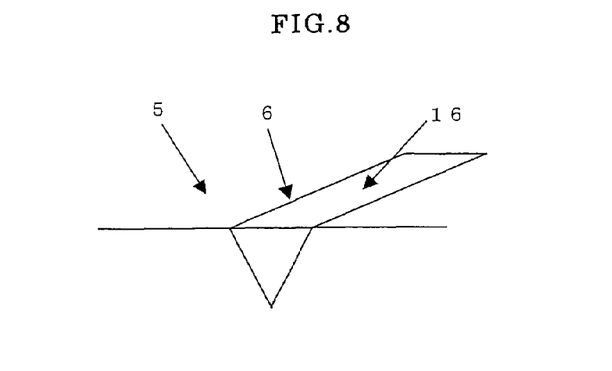
FIG. 8 is a cross-section perspective view showing grooves formed on a polishing pad surface and the groove area thereof.
Figure 9:
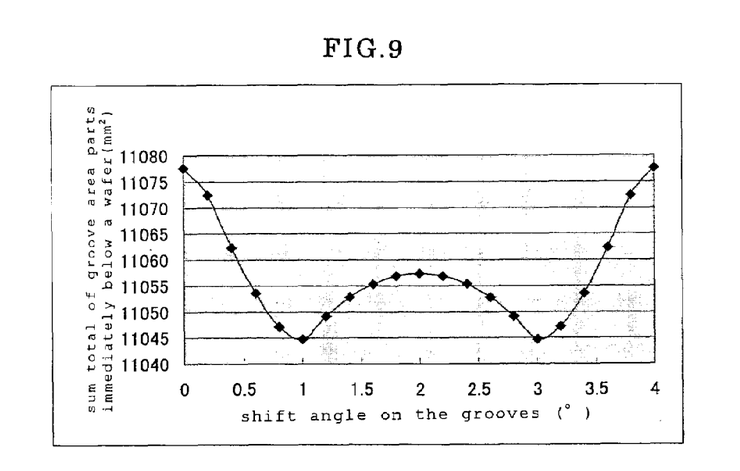
FIG. 9 is a graph showing a change of sum total of groove area parts immediately below a wafer with rotation of a polishing turn table (in the case that the wafer has a 300-mm diameter).

In addition, the polishing pad is compressed with load given to a silicon single crystal wafer or an SOI wafer in the polishing. Therefore, there is a possibility that the sum total of the groove volumes immediately below the wafer also varies. The sum total of groove areas (regions of sign 16 shown in FIG. 8) of the groove parts (regions of sign 8 in FIG. 5) existing immediately below the wafer varies periodically with rotation of a polishing turn table as shown in FIG. 9. The region in which groove parts (regions of sign 8 in FIG. 5) existing immediately below the wafer are subtracted from a main surface of the wafer (regions of sign 9 in FIG. 5) is subjected to the load given to the wafer. However, the sum total of groove areas of groove parts immediately below a wafer varies periodically as described above, and therefore, the area of the wafer regions subjected to the load also periodically varies, and along with this, the groove volumes to be compressed immediately below the wafer also periodically vary. As mentioned above, for calculating the true groove volumes, very complex work operation is required. However, by experiments of the present inventor, it has been found that if an average value of the sum totals of the groove volumes immediately below a wafer has the above-described relation with the area of the wafer at the step before the polishing pad is compressed, surface flatness of a silicon single crystal wafer or film-thickness uniformity of an SOI wafer can be maintained good.

In this case, it is preferable that the angles between the grooves are more than the angles obtained by the mathematical formula 1 as follows.

An angle between the grooves=2×sin$^{-1}$(a width of the grooves/(2×(a distance from the center of the polishing pad to the center of the wafer−a radius of the wafer)). (Mathematical Formula 1)

Figure 10:
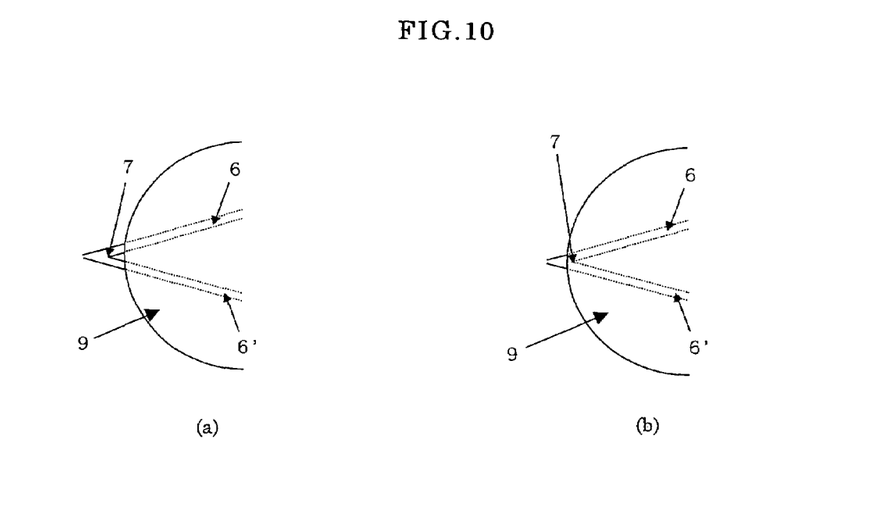
FIG. 10 is a schematic view showing the location of an intersection point of the grooves. (a) is the case that an angle between the grooves are larger than the mathematical formula 1. (b) is the case that an angle between the grooves are the mathematical formula 1 or less.

If the angles between the grooves are more than angles obtained by the above-described mathematical formula 1, as shown in FIG. 10 (a), an intersection point 7 where a groove 6 and a groove 6' overlap each other is located outside the wafer 9, and therefore there is no problem. However, if the angles between the grooves are angles obtained by the above-described mathematical formula 1 or less, the intersection point 7 is located immediately below the wafer 9 as shown in FIG. 10 (b). The polishing pad in the vicinity of this intersection point is grooving-processed from the both sides thereof, therefore the polishing pad peels or twists, and there is a possibility that flatness of the polishing pad in itself cannot be maintained. If such a state is transferred to a wafer surface by polishing, there is a possibility that surface flatness of a silicon single crystal wafer is degraded or film-thickness uniformity of an SOI wafer cannot be maintained. Moreover, there is a possibility that burr is generated in the groove-formed parts by such peeling or twisting of the polishing pad as described above. If burr is generated, there is possibility that a surface of the silicon single crystal wafer or the SOI wafer is flawed in polishing. Therefore, it is preferable that the angles between the grooves are larger than angles obtained by the above-described mathematical formula 1.

In the above-described mathematical formula, the width of the grooves is arbitrarily determined by the distance from the center of the polishing pad to the center of the wafer and the radius of the wafer to be polished. However, it is preferable that the width of the grooves is 2.0 mm or less as described above. If the width of the grooves becomes larger, concavity and convexity formed on the polishing pad with the polishing pad surface and the grooves tend to be transferred to the surface of the wafer to be polished and a possibility of surface flatness of a silicon single crystal wafer or film-thickness uniformity of an SOI wafer being adversely affected becomes higher. If the groove widths are 2.0 mm or less, the flat polishing pad surface to get contact with a wafer is greatly larger than the grooves to get contact with the wafer and therefore the possibility that the concavity and convexity on the polishing pad adversely affect the surface of the wafer to be polished becomes lower. In addition, it is more preferable that the groove widths are 1.5 mm or less because the possibility of the surface of the wafer to be polished being adversely affected becomes lower. Furthermore, for keeping some amount of a polishing agent flowing in the grooves, it is more preferable that the groove widths are 0.4 mm or more.

The material of the polishing pad of the present invention may be what is generally used for polishing a substrate of silicon or the like, and for example, expandable polyurethane can be used independently of the foam density, the foam size, or the like, and polyurethane of a suede type or a polyester nonwoven cloth can also be used. In particular, the polishing pad of a nonwoven type can be suitably used for polishing a silicon single crystal wafer in which high surface flatness is required. Moreover, the polishing pad of a suede type can be suitably used for polishing an SOI wafer in which high film-thickness uniformity is required.

After the groove volumes, the angles between the grooves, the groove widths, the groove depths, and such of the grooves to be formed are determined, in order to form the grooves, a polishing pad is fixed to a conventional grooving apparatus and the polishing pad is grooving-processed by using grooving jigs. One example of the specific processing procedure will be explained with reference to FIG. 1. C represents the polishing pad center and A represents the polishing pad surface before the grooving, respectively. First, a tip end of the jig is brought into contact with the polishing pad surface A and the height is defined as the original point. Next, after the jig is once moved to a location of the peripheral side of the polishing pad in which the polishing pad does not exist, the tip end of the grooving jig is lowered to the height of B which is a desired groove depth. Then, the grooving is performed by making the grooving jig cut into the polishing pad periphery to the polishing pad center. The surface of B formed at this time corresponds to the groove bottom, and which is formed with a constant depth at first. The grooving process with a constant depth is performed from the polishing pad periphery to at least the groove parts which get into immediately below a wafer in the wafer polishing, namely, to the location of the wafer edge in the central side of the polishing pad, and the grooves nearer to the center than that are processed so as to have a shallower groove depth.

As a method for forming shallow grooves in this case, grooves having a constant depth are formed from the peripheral edge of the polishing pad to the location of the grooves which get into immediately below the wafer, and the processing is continued with shallowing the groove depth as it is. After obtaining a desired groove depth, the grooves may be formed to the center of the polishing pad with the constant groove depth. In the example as shown in FIG. 1, after forming the outer grooves of the groove parts which get into immediately below a substrate, the grooving process is continued toward the polishing pad center with shallowing the groove depth. When the groove depth becomes D, feeding of the grooving jig in the upward direction is halted, and then, the grooves having a constant depth are formed to the center of the polishing pad. The surface of D represents the bottom face of the shallow grooves formed in the central side of the polishing pad. In addition, the groove shape may be any shape as long as a required amount of a polishing agent can be flowed to immediately below a substrate in polishing. For example, V-shape grooves with V-shape bottoms, or U-shape grooves with U-shape bottoms is possible. With regard to a groove depth, at least, about 0.5-2 mm is preferable for the groove parts from the polishing pad periphery to the substrate edge in the central side of the polishing pad, and as to the groove parts nearer to the center than that, about 0.5 mm or less is preferable in the case of forming shallow grooves.

Moreover, such processing may be carried out with machine besides being carried out with hand as described above. In the case of grooving with machining, a rotating ultra-hard reamer is brought into contact with the polishing pad from the peripheral side face of the polishing pad, and the processing can be performed toward the center of the polishing pad. In this case, it is necessary that the grooves in the inner side than the location of the wafer edge of the wafer in the central side of the polishing pad are shallowly formed in the same manner as described above. Moreover, in the case of machining, if the groove widths are about 0.1 mm or more, the processing is possible. However, it is preferable that the groove widths are 0.4 mm or more by the same reason as described above.

Moreover, in particular, such processing is suitably used in a polishing pad used for a CMP apparatus of single wafer processing without the central part of the polishing pad being cut out. In the case of not cutting out the central part of the polishing pad, the polishing pad in the vicinity of the rotation center becomes a state where grooves overlap each other and therefore it is cut repeatedly with the grooving jig. Therefore, the widths of the polishing pad existing between the grooves become extremely narrow. In a process that such a polishing pad having narrow widths is formed, if the cutting is performed with the groove depth being deep, a polishing pad in itself twists and the flatness can not be maintained. Moreover, if such twist of polishing pad occurs in the cutting, burr can be generated in the groove parts. In this case, it is preferable that the grooves are formed with the groove depth being shallow because twist of the polishing pad becomes small and the generation of burr is also reduced.

In addition, it is preferable that the grooves to be formed on the polishing pad are formed without interruption from the peripheral edge of the polishing pad to the center of the polishing pad. In the case that the grooves formed from the center of the polishing pad are formed only to the location of the polishing pad which gets into immediately below the wafer, burr can be generated at the termination of the grooves immediately below the wafer due to formation of the grooves. And the generated burr can lead to generation of flaws on the surface to be polished of the wafer.

Moreover, in the process for forming the grooves having a constant depth as described above, it is possible to change the constant value of the groove depth during the process. However, if the cutting depth is made to be sharply large, burr can be generated in the groove parts, and therefore, in the case of forming the grooves having a constant depth, it is preferable that the depth of the grooves is not changed.

In addition, for example, when a wafer having a 200-mm diameter is polished with an apparatus for polishing a wafer having a 300-mm diameter, the angles between the grooves can be more than 5°. If the angles between the grooves are more than 5°, neither peeling nor generation of burr along with grooving is caused in the polishing pad existing between the grooves, and therefore, the grooving process can be performed so that the depth of a groove to be formed is constant from the polishing pad periphery to the center thereof and that only the relation of the groove volume and the wafer area is noted. Of course, as described above, the processing may be performed at a predetermined groove depth from the polishing pad periphery to the location of the wafer edge in the central side of the polishing pad and the processing may be performed at a shallower groove depth nearer to the center than that.

After the formation of the first groove as described above, the polishing pad is rotated at a determined angle between the grooves and the second groove is formed in the same manner. By repeating this operation, grooves having a desired shape at desired groove angles are formed in a radial pattern on the polishing pad. These grooves are formed so that an intersection point where the grooves overlap each other at the central part of the radial pattern of the grooves does not exist immediately below the wafer. The polishing pad processed as described above is shown in FIG. 2. This polishing pad 20 is preferably a nonwoven type or a suede type, and the grooves 21 are formed in a radial pattern. And [the average value of the sum totals of the groove volumes in parts immediately below the substrate ($mm^3$)/area of the substrate ($mm^2$)] is 0.06 to 0.23, and the grooves 21 has a predetermined groove depth from the polishing pad periphery to the location of the wafer edge in the central side of the polishing pad and has a shallower groove depth nearer to the center than that. An intersection point where the grooves overlap each other at the central part of the radial pattern of the grooves 21 does not exist immediately below the wafer. Moreover, the groove widths of the grooves 21 is preferably 2.0 mm or less, and more preferably, 0.4 mm or more. It is preferable that the grooves are formed so that angles between the grooves are more than the values obtained by the following formula.

Figure 2:
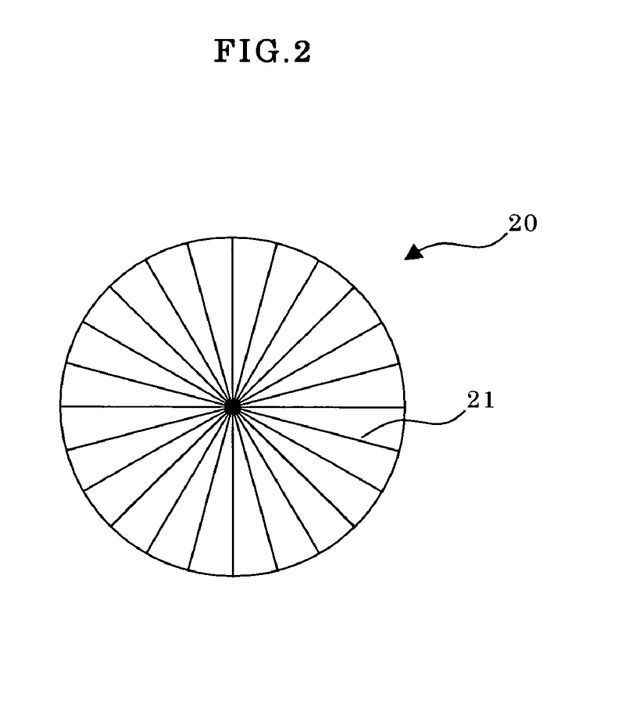
FIG. 2 is a schematic view of a polishing pad according to the present invention.

An angle between the grooves=$2\times\sin^{-1}$(a width of the grooves/($2\times$(a distance from the center of the polishing pad to the center of the wafer–a radius of the wafer)) (Mathematical Formula 1)

The polishing pad of the present invention or the polishing pad processed by the processing method of the present invention is attached to a turn table of a polishing apparatus and a wafer is polished, and thereby a wafer with a high accuracy of the surface flatness without a flaw can be produced. In particular, if a wafer to be polished is a silicon single crystal wafer, one having high surface flatness can be produced, and if an SOI wafer, one having high film-thickness uniformity in the silicon active layer can be produced.

As described above, it is sufficiently effective that the relation of [the average value of the sum totals of the groove volumes in parts immediately below a wafer/area of the wafer] and the relation of the groove depths in the present invention are satisfied respectively. However, if they are satisfied at the same time, a substrate can be polished to achieve better flatness.

Hereinafter, Examples according to the present invention and Comparative Examples will be explained in detail. However, the present invention is not limited thereto.

EXAMPLE 1

Grooves were formed on a polishing pad of a polyurethane suede type by the method of the present invention as follows: The distance between the center of the polishing pad and the center of a wafer to be polished was 200 mm. The wafer to be polished was an SOI wafer having a 300-mm diameter. The groove shape was V-shape groove. The groove depth from the polishing pad periphery to the location of the wafer edge in the central side of the polishing pad was 1.5 mm. The groove depth of the parts having a constant groove depth from the location of the wafer edge in the central side of the polishing pad to the center of the polishing pad was 0.5 mm. The groove widths were 2.0 mm. The angles between the grooves were 4°. The number of the grooves was 90. In this case, the value that the average value of the sum totals of the groove volumes in parts immediately below the SOI wafer was divided by the SOI wafer area was 0.117. Such a polishing pad as described above was attached to a turn table of a polishing apparatus and the SOI wafer having a 300-mm diameter was polished. As a result, an SOI film-thickness range, which is the index indicating film-thickness uniformity of a silicon active layer thereof, was 4.21 nm. Here, the SOI film-thickness range was the difference between the maximum thickness of the silicon active layer and the minimum thickness thereof. Moreover, there was no generation of flaws and such on the polished surface of the SOI wafer.

EXAMPLE 2

Grooves were formed on a polyurethane polishing pad so that the distance between the center of the polishing pad and the center of a wafer to be polished was 200 mm, the angles between the grooves were 12°, the groove shape was U-shape groove, the groove widths were 2.0 mm and the number of the grooves was 30. In this polishing pad, the angles between the grooves were large and therefore the groove depth from the location of the peripheral edge of the polishing pad to the center of the polishing pad was constant, 1.5 mm. In the case that the wafer to be polished was an SOI wafer having a 200-mm diameter, the value that the average value of the sum totals of the groove volumes in parts immediately below the wafer was divided by the SOI wafer area was 0.065. Such a polishing pad as described above was attached to a turn table of a polishing apparatus and the SOI wafer having a 200-mm diameter was polished. As a result, the SOI film-thickness range was 4.87 nm. Moreover, there was no flaws on the polished surface of the SOI wafer.

COMPARATIVE EXAMPLE 1

Grooves were formed on a polyurethane polishing pad so that the distance between the center of the polishing pad and the center of a wafer to be polished was 200 mm, the angles between the grooves were 15°, the groove shape was U-shape groove, the groove widths were 2.0 mm and the number of the grooves was 24. In this polishing pad, the angles between the grooves were large and therefore the groove depth from the location of the peripheral edge of the polishing pad to the center of the polishing pad was constant, 1.5 mm. In the case that a wafer to be polished was an SOI wafer having a 300-mm diameter, the value that the average value of the sum totals of the groove volumes in parts immediately below the wafer was divided by the SOI wafer area was 0.041. Such a polishing pad as described above was attached to a turn table of a polishing apparatus and the SOI wafer having a 300-mm diameter was polished. As a result, the SOI film-thickness range was 6.00 nm. Moreover, there was no flaws on the polished surface of the SOI wafer.

COMPARATIVE EXAMPLE 2

Grooves were formed on a polyurethane polishing pad so that the distance between the center of the polishing pad and the center of a wafer to be polished was 200 mm, the wafer to be polished was an SOI wafer having a 300-mm diameter, the groove shape was V-shape groove, the groove depth from the polishing pad periphery to the location of the wafer edge in the central side of the polishing pad was 1.5 mm, the groove depth of the parts having a constant groove depth from the location of the wafer edge in the central side of the polishing pad to the center of the polishing pad was 0.5 mm, the groove widths were 2.0 mm, the angles between the grooves were 2°, the number of the grooves was 180. In this case, the value that the average value of the sum totals of the groove volumes in parts immediately below the SOI wafer was divided by the SOI area was 0.234. Such a polishing pad as described above was attached to a turn table of a polishing apparatus and the SOI wafer having a 300-mm diameter was polished. As a result, the parts where grooves overlap each other got into immediately below the wafer and flaws were generated on the polished surface of the SOI wafer.

The present invention is not limited to the embodiments described above. The above-described embodiments are merely examples, and those having the substantially same constitution as that described in the appended claims and providing the similar working effects are included in the scope of the present invention.

For example, SOI wafers were exemplified as the Examples and the Comparative Examples. However, a silicon single crystal wafer may be used. Moreover, with regard to a diameter of a wafer, although ones having a 200-mm diameter and a 300-mm diameter were exemplified, the diameter may be the same or more or less than that.

Moreover, as long as flaws to be generated on a wafer can be prevented, a polishing pad to be used may be a polishing pad whose surface is at least made of foaming urethane, non-foaming epoxy resin, acrylic resin, polyester resin, vinyl chloride resin, or polycarbonate resin.

INDUSTRIAL APPLICABILITY

The present invention can be used for a polishing pad used for polishing substrates including a silicon single crystal wafer, a step for grooving of such a polishing pad, and production of substrates.

The invention claimed is:

1. A method for polishing a circular substrate having a predetermined cross-sectional area with a polishing pad, the polishing pad comprising a center and a polishing surface upon which V-shaped or U-shaped grooves having a radial pattern are formed, the method comprising:

disposing the substrate laterally outward from the center of the polishing pad with a portion of the polishing pad surface provided immediately below the substrate; and polishing the substrate using the polishing pad, wherein an average value of the total volumes of all grooves in the portion of the polishing pad surface immediately below the substrate is 0.06 to 0.23 when represented by the average value of the total groove volumes in the polishing pad portion ($mm^3$)/area of the substrate ($mm^2$).

2. The method according to claim 1, wherein the grooves have a constant groove width and are formed so that angles between the grooves are more than the values obtained by the mathematical formula 1 as follows:

an angle between the grooves=$2 \times \sin^{-1}$ (a width of the grooves/($2 \times$(a distance from the center of the polishing pad to the center of the substrate−a radius of the substrate))).   (Mathematical formula 1).

3. The method according to claim 1, wherein the grooves have groove widths of 2.0 mm or less.

4. The method according to claim 1, wherein the polishing pad is a nonwoven type or a suede type.

5. The method for polishing a substrate according to claim 1, wherein as the substrate to be polished, a silicon single crystal wafer or an SOI wafer is used.

6. A method for processing a circular polishing pad having a center and a surface, the pad being used for polishing a circular substrate having a known cross-sectional area, the method comprising forming V-shaped or U-shaped grooves on the surface of the polishing pad so as to have a radial pattern, and at this time forming the grooves so that during use when at least a portion of the circular polishing pad is located immediately below the circular substrate, an average value of the total volumes of all grooves in the polishing pad surface portion existing immediately below the substrate complies with a relation of 0.06 to 0.23 when represented by the average value of the total groove volumes in the polishing pad portion ($mm^3$)/area of the substrate ($mm^2$).

7. The method for processing a polishing pad according to claim 6, wherein the grooves are formed so that angles between the grooves are more than values obtained by the mathematical formula 1 as follows:

An angle between the grooves=$2 \times \sin^{-1}$ (a width of the grooves/($2 \times$(a distance from the center of the polishing pad to the center of the substrate−a radius of the substrate))).   (Mathematical formula 1).

8. The method for processing a polishing pad according to claim 6, wherein the grooves are formed so as to have groove widths of 2.0 mm or less.

9. The method for processing a polishing pad according to claim 6, wherein the polishing pad is a nonwoven type or a suede type.

10. A method for producing a substrate, comprising a step of polishing a substrate by using the polishing pad processed by the method according to claim 6.

11. The method for producing a substrate according to claim 10, wherein as the substrate to be polished, a silicon single crystal wafer or an SOI wafer is used.

* * * * *